(12) United States Patent
Lin et al.

(10) Patent No.: US 11,594,266 B2
(45) Date of Patent: *Feb. 28, 2023

(54) OPERATING METHOD FOR SEMICONDUCTOR CIRCUIT

(71) Applicant: MACRONIX INTERNATIONAL CO., LTD., Hsinchu (TW)

(72) Inventors: Yu-Hsuan Lin, Taichung (TW); Chao-Hung Wang, Tainan (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/195,712

(22) Filed: Mar. 9, 2021

(65) Prior Publication Data
US 2021/0193201 A1   Jun. 24, 2021

Related U.S. Application Data

(62) Division of application No. 16/154,831, filed on Oct. 9, 2018, now Pat. No. 10,971,200.

(60) Provisional application No. 62/698,976, filed on Jul. 17, 2018.

(51) Int. Cl.
  *G11C 7/00*   (2006.01)
  *G11C 7/22*   (2006.01)
  *G06F 3/06*   (2006.01)

(52) U.S. Cl.
  CPC .............. *G11C 7/22* (2013.01); *G06F 3/0604* (2013.01); *G06F 3/0659* (2013.01); *G06F 3/0679* (2013.01)

(58) Field of Classification Search
  CPC ..... G11C 11/54; G11C 7/22; G11C 29/50016; G06F 3/0604; G06F 3/0659; G06F 3/0679; G06N 3/063
  See application file for complete search history.

(56) References Cited

U.S. PATENT DOCUMENTS

| 9,785,615 B1 | 10/2017 | Merced Grafals et al. |
| 2005/0207234 A1 | 9/2005 | Baechtold et al. |
| 2009/0067237 A1 | 3/2009 | Lee et al. |
| 2014/0172937 A1 | 6/2014 | Linderman et al. |

(Continued)

FOREIGN PATENT DOCUMENTS

| CN | 101458954 A | 6/2009 |
| CN | 102194513 A | 9/2011 |
| CN | 106683704 A | 5/2017 |

*Primary Examiner* — Uyen Smet
(74) *Attorney, Agent, or Firm* — McClure, Qualey & Rodack, LLP

(57) ABSTRACT

A semiconductor circuit and an operating method for the same are provided. The method includes the following steps. A memory circuit is operated during a first timing to obtain a first memory state signal S1. The memory circuit is operated during a second timing after the first timing to obtain a second memory state signal S2. A difference between the first memory state signal S1 and the second memory state signal S2 is calculated to obtain a state difference signal SD. A calculating is performed to obtain an un-compensated output data signal OD relative with an input data signal ID and the second memory state signal S2. The state difference signal SD and the un-compensated output data signal OD are calculated to obtain a compensated output data signal OD'.

12 Claims, 5 Drawing Sheets

(56) References Cited

U.S. PATENT DOCUMENTS

| | | | | |
|---|---|---|---|---|
| 2015/0170025 A1* | 6/2015 | Wu | ................ | G06N 3/0635 |
| | | | | 706/25 |
| 2016/0371583 A1* | 12/2016 | Hosokawa | ............ | G06N 3/049 |
| 2017/0124025 A1* | 5/2017 | Gokmen | ............... | G06F 9/3887 |
| 2017/0131924 A1 | 5/2017 | Main et al. | | |
| 2018/0088801 A1 | 3/2018 | Cherubini et al. | | |

* cited by examiner

“OPERATING METHOD FOR SEMICONDUCTOR CIRCUIT”

This application is a divisional application of co-pending application Ser. No. 16/154,831, filed on Oct. 9, 2018, issued as U.S. Pat. No. 10,971,200, which claims the benefit of U.S. provisional application Ser. No. 62/698,976, filed Jul. 17, 2018, the subject matter of which is incorporated herein by reference.

BACKGROUND

Technical Field

The disclosure relates to a semiconductor circuit and an operating method for the same, and particularly to a neural network and an operating method for the same.

Description of the Related Art

With the development of software technology, the deep learning of the neural network defined by software, through the general learning process, greatly enhances the ability of artificial intelligence, such as image recognition, speech recognition, natural language understanding and decision making. The emergence of a hardware neural network (HNN) further reduces the hardware size, cost and power consumption of deep learning systems. The HNN consists of a network of neurons interconnected by synapses, which can have thousands of synapses, where the weight of the synapse can be optimized during training.

SUMMARY

The present disclosure relates to a semiconductor circuit and an operating method for the same.

According to an embodiment, an operating method for a semiconductor circuit is disclosed. The method comprises the following steps. A memory circuit is operated during a first timing to obtain a first memory state signal S1. The memory circuit is operated during a second timing after the first timing to obtain a second memory state signal S2. A difference between the first memory state signal S1 and the second memory state signal S2 is calculated to obtain a state difference signal SD. A calculating is performed to obtain an un-compensated output data signal OD relative with an input data signal ID and the second memory state signal S2. The state difference signal SD and the un-compensated output data signal OD are calculated to obtain a compensated output data signal OD'.

According to another embodiment, a semiconductor circuit is disclosed. The semiconductor circuit comprises a main memory array, a reference memory array, a memory device, and a processing circuit. The memory device is for storing a first memory state signal S1 obtained by operating a reference memory array during a first timing. The processing circuit is for reading a second memory state signal S2 of a second timing after the first timing of the reference memory array, and for calculating an un-compensated output data signal OD relative with an input data signal ID and a another second memory state signal S2 of the second timing of the main memory array. The memory device is electrically coupled with the processing circuit.

The above and other embodiments of the disclosure will become better understood with regard to the following detailed description of the non-limiting embodiment(s). The following description is made with reference to the accompanying drawings.

DETAILED DESCRIPTION

Figure 1:
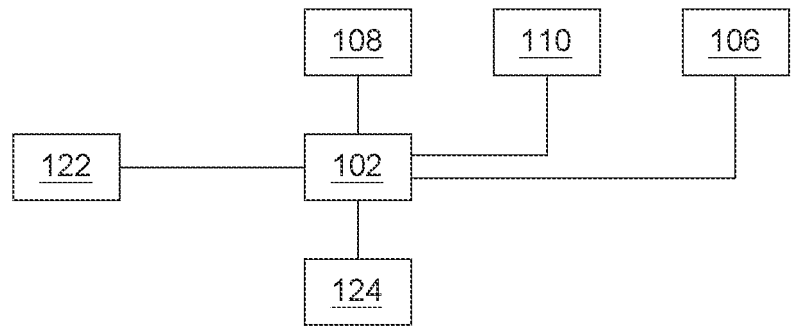
FIG. 1 illustrates a semiconductor circuit according to a concept of an embodiment.
Figure 2:
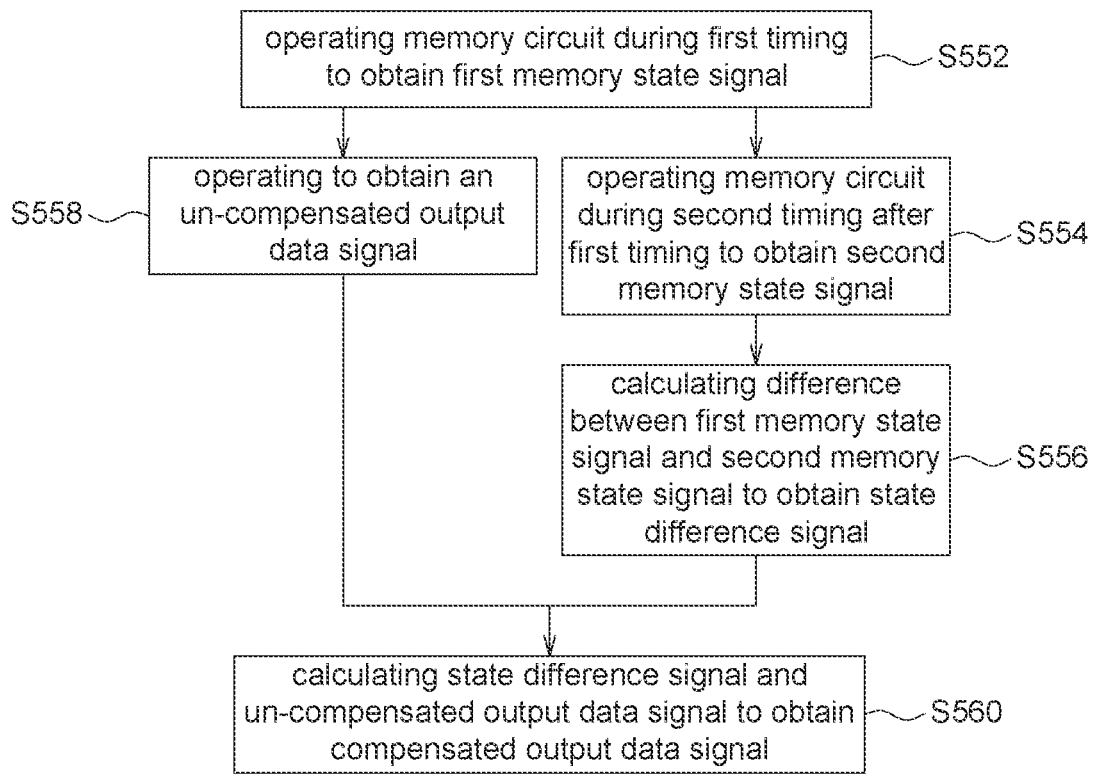
FIG. 2 illustrates an operating method of the semiconductor circuit according to a concept of an embodiment.

FIG. 1 illustrates a semiconductor circuit according to a concept of an embodiment. FIG. 2 illustrates an operating method of the semiconductor circuit according to a concept of an embodiment.

Referring to FIG. 1, the semiconductor circuit comprises a memory circuit, and a processing circuit 102. The memory circuit comprises a memory device 106, a main memory array 108, and a reference memory array 110. The memory device 106, the main memory array 108 and the reference memory array 110 may be disposed in one chip product, for example, formed on one semiconductor chip. The processing circuit 102 may be electrically coupled among the memory device 106, the main memory array 108, and the reference memory array 110. In an embodiment, the semiconductor circuit shown in FIG. 1 may be a neural network node, the processing circuit 102 processes input data signals ID from an input data terminal 122 to generate an output data signal, and transfer the output data signal to a data output terminal 124. Weights of synapse by which the input data signals ID multiplies are storied in memory cells in the main memory array 108. The processing circuit 102 may be coupled between the input data terminal 122 and the data output terminal 124. The processing circuit 102 may be electrically coupled between the input data terminal 122 and the data output terminal 124.

Referring to FIG. 1 and FIG. 2, the operating method for the semiconductor circuit comprises a step S552: operating the memory circuit during a first timing t1 to obtain a first memory state signal S1. In an embodiment, the reference memory array 110 may be programed during the first timing t1 to a programed memory state so as to generate a first memory state signal S1 (e.g. electrical conductance $G_{i,t1}$ or electrical conductance $G_{ref,t1}$) to the reference memory array 110.

The processing circuit 102 may be used to read the first memory state signal S1 (e.g. electrical conductance $G_{i,t1}$ or electrical conductance $G_{ref,t1}$) from the reference memory array 110, and transfer the first memory state signal S1 to the memory device 106, and the first memory state signal S1 is stored by the memory device 106. In an embodiment, the processing circuit 102 may be used to calculate the first memory state signal S1 from the reference memory array 110 (e.g. electrical conductance values $G_{i,t1}$ of the memory cells of the reference memory array 110), and then transfer the calculated first memory state signal S1 (e.g. an electrical conductance value $G_{ref,t1}$) to the memory device 106 for storing the calculated first memory state signal S1. In an embodiment, the first memory state signal S1 from the reference memory array 110 may be memory unit signals (e.g. electrical conductance $G_{i,t1}$, i=1, 2, 3 ... ) stored by memory units of the reference memory array 110 by a programing step, and the calculated first memory state signal S1 (e.g. electrical conductance $G_{ref,t1}$) obtained through the processing circuit 102 by calculating the memory unit signals is smaller than a maximum of the memory unit state signals (e.g. the maximum Gmax of the electrical conductance values $G_{i,t1}$), and is bigger than a minimum of the memory unit state signals (e.g. the minimum Gmin of the electrical conductance values $G_{i,t1}$). In an embodiment, the calculated first memory state signal S1 (e.g. electrical conductance $G_{ref,t1}$) is a mean, a median, or a mode of the memory unit state signals (e.g. electrical conductance $G_{i,t1}$, i=1, 2, 3 ... ).

In an embodiment, a memory structure of the reference memory array 110 is identical with a memory structure of the main memory array 108. Therefore, it could be presumed that the programed reference memory array 110 and the programed main memory array 108 may have the same first memory state. In other words, it could be presumed that the first memory state signal S1 stored by the memory device 106 would be the same with that from the main memory array 108.

In an embodiment, the reference memory array 110 and the main memory array 108 may be simultaneously programed during the first timing t1 with the same programing parameters. In an embodiment, the programing step may generate the same first memory state signal S1 to the reference memory array 110 and the main memory array 108.

Then, a step S554: operating the memory circuit during a second timing t2 after the first timing t1 to obtain a second memory state signal S2, is performed.

The processing circuit 102 may be used to read a second memory state signal S2 of the second timing t2 (e.g. electrical conductance $G_{i,t2}$, or electrical conductance $G_{ref,t2}$) from the reference memory array 110. In an embodiment, the processing circuit 102 may be used to calculate the original second memory state signal S2 (e.g. electrical conductance $G_{i,t2}$) from the reference memory array 110 to obtain a calculated second memory state signal S2 (e.g. electrical conductance $G_{ref,t2}$). In an embodiment, the second memory state signal S2 from the reference memory array 110 may be memory unit signals (e.g. electrical conductance $G_{i,t2}$, i=1, 2, 3 ... ) stored by memory units of the reference memory array 110 by a programming step, and the calculated second memory state signal S2 (e.g. electrical conductance $G_{ref,t2}$) obtained through the processing circuit 102 by calculating the memory unit signals is smaller than a maximum of the memory unit state signals (e.g. the maximum Gmax of the electrical conductance values $G_{i,t2}$), and is bigger than a minimum of the memory unit state signals (e.g. the minimum Gmin of the electrical conductance values $G_{i,t2}$). In an embodiment, the calculated second memory state signal S2 (e.g. electrical conductance $G_{ref,t2}$) is a mean, a median, or a mode of the memory unit state signals (e.g. electrical conductance $G_{i,t2}$, i=1, 2, 3 ... ). In an embodiment, the calculated first memory state signal S1 (e.g. electrical conductance $G_{ref,t1}$) and the calculated second memory state signal S2 (e.g. electrical conductance $G_{ref,t2}$) are obtained through the same arithmetical operation, e.g. median calculation.

In an embodiment, the memory structure of the reference memory array 110 is identical with the memory structure of the main memory array 108. Therefore, it could be presumed that the programed reference memory array 110 and the programed main memory array 108 may have the same second memory state of the second timing t2. In other words, it could be presumed that the second memory state signal S2 get through reading or calculating by the processing circuit 102 would be the same with that from the main memory array 108.

In an embodiment, the reference memory array 110 and the main memory array 108 comprise a ReRAM, a phase change memory, or a conductive-bridging random access memory, data retention of which may vary with time change. In other words, there is a shift of for the memory state signal of the reference memory array 110 and/or the main memory array 108 from the first memory state signal S1 of the first timing t1 to the second memory state signal S2 of the second timing t2. A difference between the first memory state signal S1 and the second memory state signal S2 would increase as the retention time is longer. Therefore, the memory state signal (or weight) of the main memory array 108 of the second timing t2 would have lower accuracy. In an embodiment, the reference memory array 110 and the main memory array 108 have the same 1-transistor-1-ReRAM (1T1R) structure, and the 1T1R of the main memory array 108 is used as a synapse.

Next, a step S556: calculating a difference between the first memory state signal S1 and the second memory state signal S2 to obtain a state difference signal SD, is performed. The processing circuit 102 may be used to read the first memory state signal S1 (e.g. electrical conductance $G_{ref,t1}$) stored in the memory device 106, and calculate based on the first memory state signal S1 (e.g. electrical conductance $G_{ref,t1}$) and the second memory state signal S2 (e.g. electrical conductance $G_{ref,t2}$) to obtain the state difference signal SD (e.g. $\Delta = G_{ref,t2} - G_{ref,t1}$). In an embodiment, the memory device 106 comprises a flash memory, a read-only memory (ROM), or a one-time program (OTP) memory, and a memory state of which would not vary substantially with time timing change. Therefore, the first memory state signal S1 stored in the memory device 106 would not vary with time change. The first memory state signal S1 during the second timing t2 would be substantially the same with the first memory state signal S1 during the first timing t1. In an embodiment, the state difference signal SD is obtained by subtracting the first memory state signal S1 from the second memory state signal S2. For example, in an embodiment, the state difference signal SD may be presented as $\Delta = G_{ref,t2} - G_{ref,t1}$. In other words, the state difference signal SD (e.g. difference $\Delta$) may be regarded as a difference degree between the memory state signals of the main memory array 108 of the first timing t1 and the second timing t2.

After the step S552, a step S558: performing an operating to obtain an un-compensated output data signal OD, is performed. The un-compensated output data signal OD is relative with the input data signal ID from an input data terminal 122 and the second memory state signal S2 of the second timing t2 of the main memory array 108. The processing circuit 102 may be used to read the input data signal ID from the input data terminal 122, and read the second memory state signal S2 of the main memory array 108, and then perform a calculating according to the input data signal ID and the second memory state signal S2 to obtain the un-compensated output data signal OD. In an embodiment, input data signal ID is the voltage $V_i$, the second memory state signal S2 is the electrical conductance $G_{i,t2}$, the un-compensated output data signal OD is current $I_{out,t2}=\Sigma V_i * G_{i,t2}$, i=1, 2, 3 .... The un-compensated output data signal OD is relative with the second memory state signal S2 of the main memory array 108 of the second timing t2 which shifts from the first memory state signal S1 of the first timing t1, and thus the un-compensated output data signal OD has a low accuracy.

A step S560: calculating the state difference signal SD and the un-compensated output data signal OD to obtain a compensated output data signal OD', is performed. In an embodiment, the step S560 may be performed by the processing circuit 102. In embodiments, the calculated compensated output data signal OD' has higher accuracy than the un-compensated output data signal OD. In other words, the compensated output data signal OD' is more close to an output data signal based on the memory state of the main memory array 108 during the first timing t1. In an embodiment, the compensated output data signal OD' is a current $I_{out,t2m}=I_{out,t2}-\Delta*\Sigma V_i$.

In embodiments, the first memory state signal S1 and the second memory state signal S2 have a first electrical measurement unit. The input data signal ID has a second electrical measurement unit. The un-compensated output data signal OD and the compensated output data signal OD' have a third electrical measurement unit. The first electrical measurement unit, the second electrical measurement unit and the third electrical measurement unit are electrical measurement units different from each other, and comply with Ohm's law. In an embodiment, the first electrical measurement unit is a unit of electrical conductance, the second electrical measurement unit is a unit of voltage, and the third electrical measurement unit is a unit of current.

In an embodiment, SD=S2−S1, OD=ID*S2, OD'=OD−(SD*ID).

Figure 3:
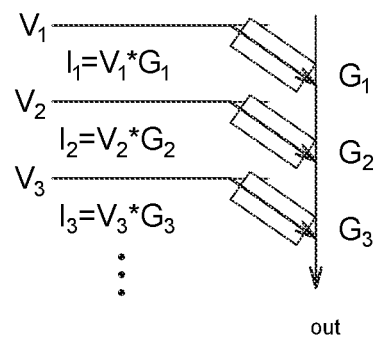
FIG. 3 and FIG. 4 illustrate the operating method of the semiconductor circuit according to a concept of an embodiment.
Figure 4:
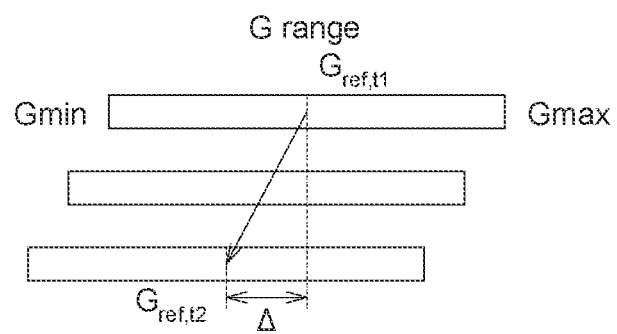
Figure 5:
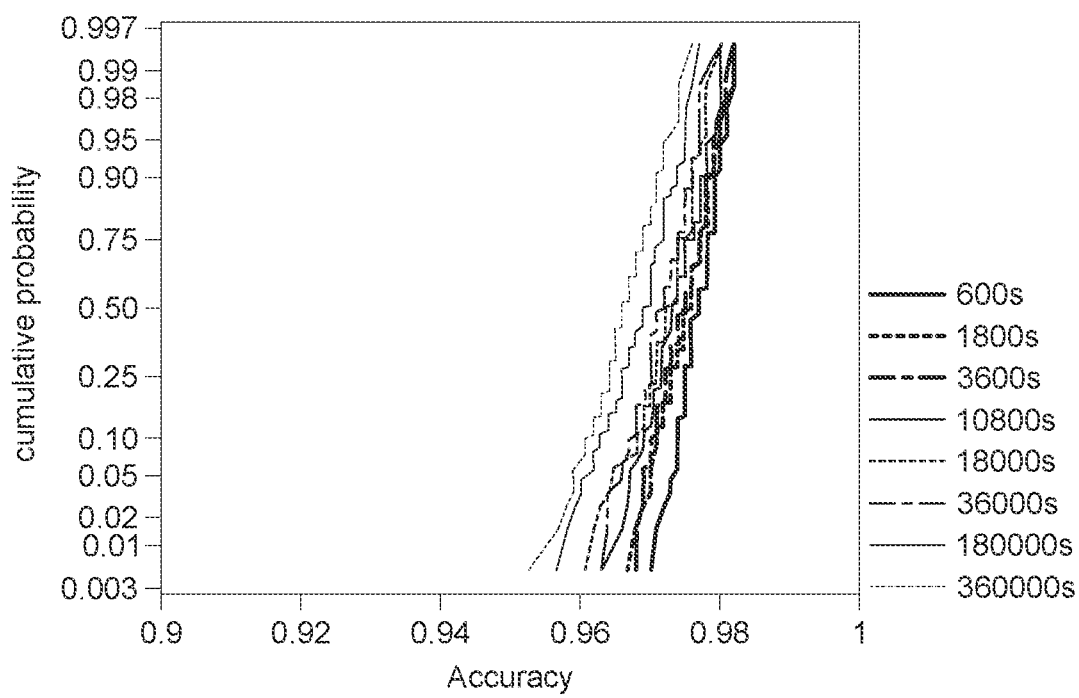
FIG. 5 shows curves of G range resulted from the semiconductor circuit according to the concept of embodiments operated by using the compensated output data by the 150° C. retention test.
Figure 6:
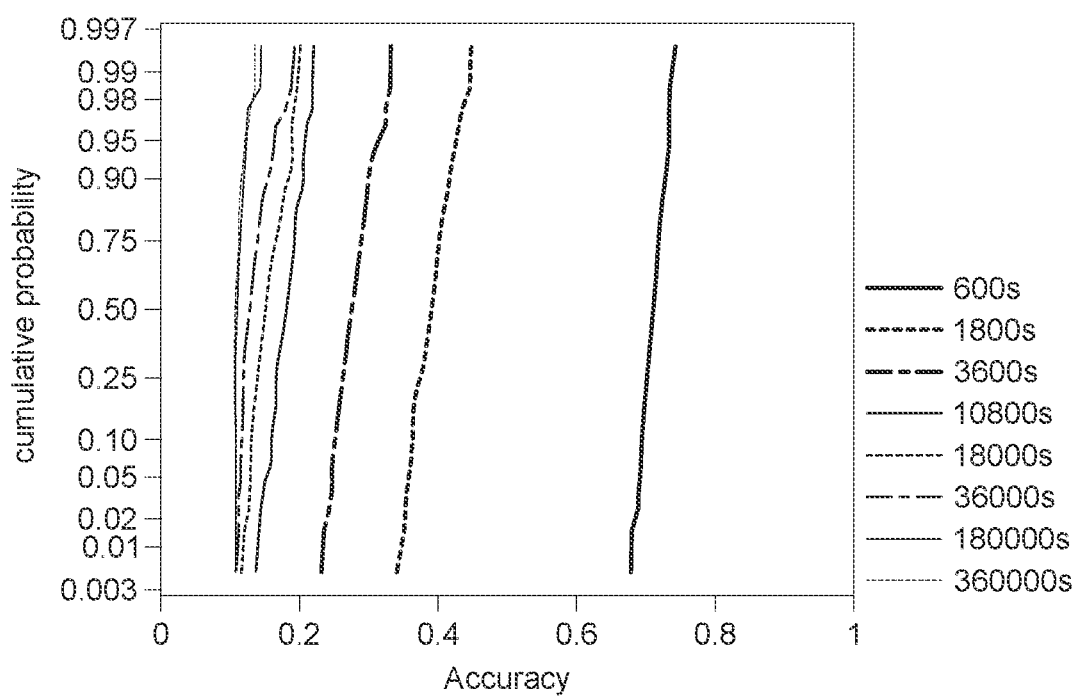
FIG. 6 shows result curves in comparative examples using only the un-compensated output data by the 150° C. retention test.

FIG. 3 and FIG. 4 illustrate the operating method of the semiconductor circuit according to a concept of an embodiment. Referring to FIG. 3, input data $V_1, V_2, V_3$ ... (i.e. voltage $V_i$, i=1, 2, 3 ... ) are respectively multiplied by weights $G_1, G_2, G_3$ ... (i.e. electrical conductance $G_i$, i=1, 2, 3 ..., wherein an electrical conductance of the first timing t1 may be indicated as $G_{i,t1}$, an electrical conductance of the second timing t2 may be indicated as $G_{i,t2}$) stored in the memory cells of the main memory array to obtain products $I_1, I_2, I_3$ (i.e. currents $I_i$, i=1, 2, 3 ..., wherein a current of the first timing t1 may be indicated as $I_{i,t1}$, a current of the second timing t2 may be indicated as $I_{i,t2}$), the products are summed up to obtain the output data $I_{out}=\Sigma V_i*G_i=I_1+I_2+I_3+$ .... Referring to FIG. 4, in the embodiment, one reference memory state Gref is get from a conductance range (G range) of between the maximum memory state (Gmax) and the minimum memory state (Gmin) among memory states $G_1, G_2, G_3$ ... stored in the memory cells of the reference memory array 110 by calculating. In other words, Gmin≤$G_{ref}$≤Gmax. Gmin and Gmax shift during a period from the first timing t1 to the second timing t2, and thus reference memory states $G_{ref}$ of the first timing t1 and the second timing t2 are different from each other (i.e. $G_{ref,t1} \ne G_{ref,t2}$). The reference memory state $G_{ref,t1}$ of the first timing t1 stored by the memory device is read. Then a difference between the reference memory state $G_{ref,t1}$ and the reference memory state $G_{ref,t2}$ of the memory cells of the reference memory array 110 of the second timing t2 is calculated. The relation of the reference memory state $G_{ref,t1}$ and the reference memory state $G_{ref,t2}$ is represented by the formula of $G_{ref,t2}=G_{ref,t1}+\Delta$. In other word, the difference $\Delta=G_{ref,t2}-G_{ref,t1}$. The output data based on the main memory array of the first timing t1 is $I_{out,t1}=\Sigma V_i*G_{i,t1}$. The (un-compensated) output data based on the main memory array of the second timing t2 is $I_{out,t2}=\Sigma V_i*G_{i,t2}=\Sigma V_i*(G_{i,t1}+\Delta)=\Sigma V_i*G_{i,t1}+\Delta\Sigma V_i$. According to the foregoing data relationships, the compensated output data $I_{out,t2m}=I_{out,t2}-\Delta*\Sigma V_i$. Compared to the un-compensated output data $I_{out,t2}$, the compensated output data $I_{out,t2m}$ has higher accuracy. FIG. 5 shows curves of G range resulted from the semiconductor circuit according to the concept of embodiments operated by using the compensated output data by the 150° C. retention test. FIG. 6 shows result curves in comparative examples using only the un-compensated output data by the 150° C. retention test. The vertical axis is cumulative probability on 100 memory arrays. It could be observed from the results in FIG. 5 and FIG. 6, the embodiments using the compensated output data have higher accuracy and better reliability.

Figure 7:
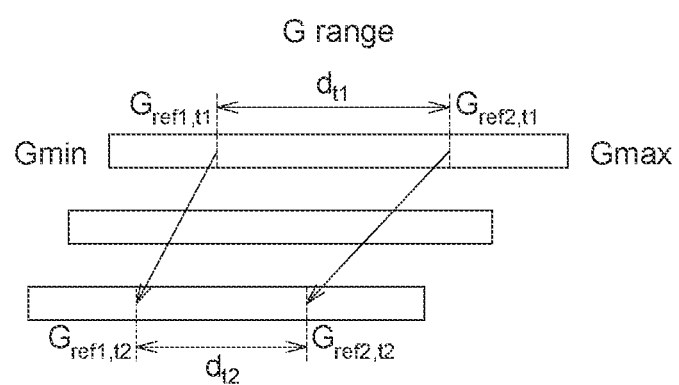
FIG. 7 illustrates the operating method of the semiconductor circuit according to the concept of another embodiment.
Figure 8:
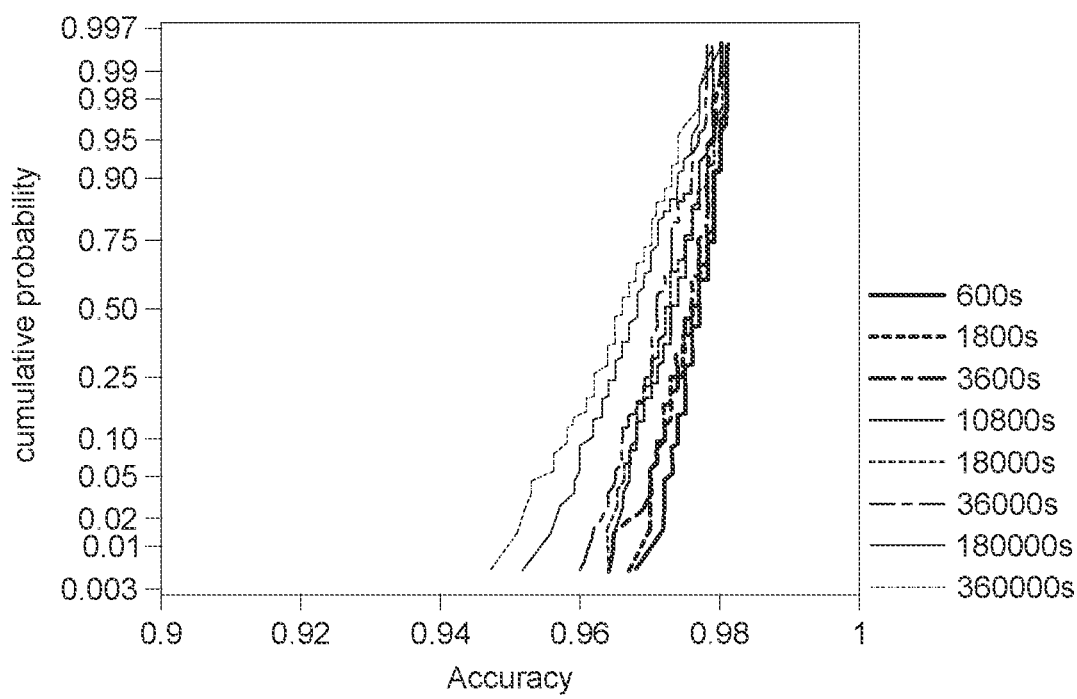
FIG. 8 shows curves of G range resulted from the semiconductor circuit according to the concept of embodiments operated by using the compensated output data by the 150° C. retention test.
Figure 9:
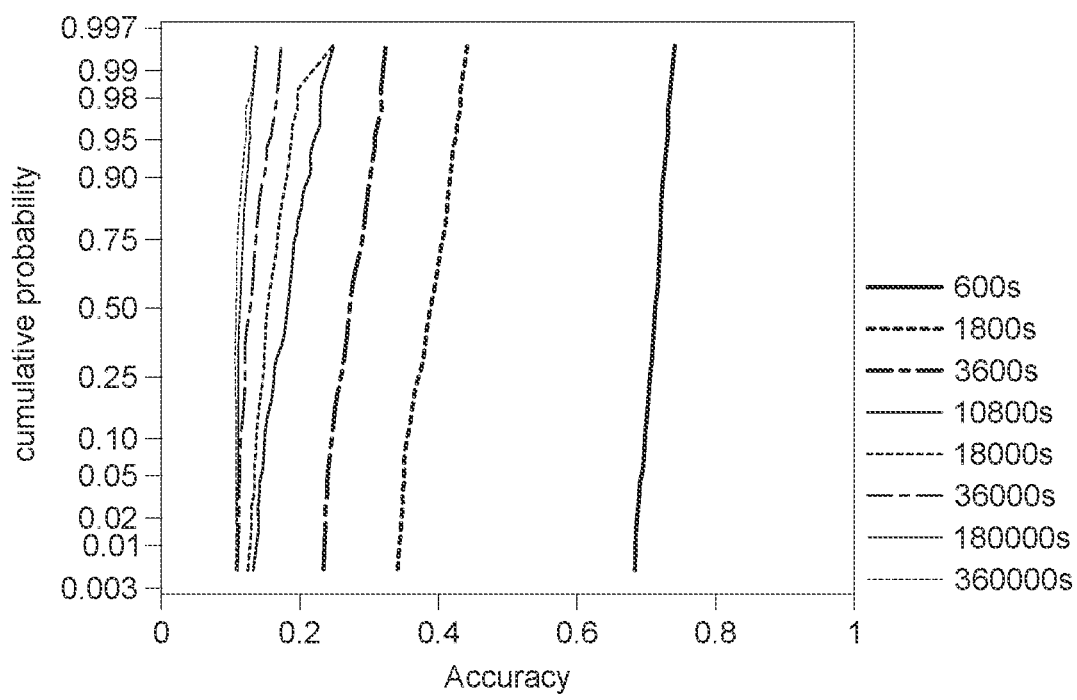
FIG. 9 shows result curves in comparative examples using only the un-compensated output data by the 150° C. retention test.

FIG. 7 illustrates the operating method of the semiconductor circuit according to the concept of another embodiment. In the embodiment, two reference memory states in the range of being smaller than the maximum memory state (Gmax) and being larger than the minimum memory state (Gmin) among the memory states stored in the memory cells of the reference memory array 110 is selected and used. In other words, the two reference memory states are respectively a first reference memory state $G_{ref1,t1}$ and a second reference memory state $G_{ref2,t1}$ for the first timing t1, and are respectively a first reference memory state $G_{ref1,t2}$ and a second reference memory state $G_{ref2,t2}$ for the second timing t2. A difference of the first reference memory states of the first timing t1 and the second timing t2 is represented by the formula: $G_{ref1,t2}=a*G_{ref1,t1}+b$; a difference of the second reference memory states of the first timing t1 and the second timing t2 is represented by the formula: $G_{ref2,t2}=a*G_{ref2,t1}+b$; and based on the foregoing formulas, it could be derived with the formula: $G_{t2}=(d_{t2}/d_{t1})*(G_{t1}-G_{ref1,t2})+G_{ref1,t1}$, wherein $d_{t1}=G_{ref2,t1}-G_{ref1,t1}$, and $d_{t2}=G_{ref2,t2}-G_{ref1,t2}$. The output data based on the main memory array of the first timing t1 is $\Sigma V_i*G_{i,t1}=I_{out,t1}$ (with a similar concept referring to FIG. 3. The un-compensated output data based on the main memory array of the second timing t2 is $\Sigma V_i*G_{i,t2}=\Sigma V_i[A/(G_{i,t1}-B)+C]=A\Sigma V_i*G_{i,t1}-AB\Sigma V_i+C\Sigma V_i$. The un-compensated output data could be compensated by calculating with the input data sum $\Sigma V_i$ and the reference memory state difference so as to obtain the compensated output data having higher accuracy than the un-compensated output data. FIG. 8 shows curves of G range resulted from the semiconductor circuit according to the concept of embodiments operated by using the compensated output data by the 150° C. retention test. FIG. 9 shows result curves in comparative examples using only the un-compensated output data by the 150° C. retention test. It could be observed from the results in FIG. 8 and FIG. 9, the embodiments using the compensated output data have higher accuracy and better reliability.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An operating method of a semiconductor circuit, comprising:
    operating a memory circuit during a first timing to obtain a first memory state signal S1 of a reference memory array;
    storing the first memory state signal S1 by a memory device;
    operating the memory circuit during a second timing after the first timing to obtain a second memory state signal S2 of the reference memory array;
    reading the second memory state signal S2 by a processing circuit;
    calculating a difference between the first memory state signal S1 and the second memory state signal S2 to obtain a state difference signal SD by the processing circuit;
    performing a calculating to obtain an un-compensated output data signal OD relative with an input data signal ID and another second memory state signal S2 of a second timing of a main memory array by the processing circuit; and
    calculating the state difference signal SD and the un-compensated output data signal OD to obtain a compensated output data signal OD' by the processing circuit.

2. The operating method of the semiconductor circuit according to claim 1, comprising:
    programing the reference memory array during the first timing to obtain the first memory state signal.

3. The operating method of the semiconductor circuit according to claim 2, wherein the reference memory array comprises ReRAM, phase change memory, or conductive-bridging random access memory.

4. The operating method of the semiconductor circuit according to claim 2, wherein the memory device comprises a flash memory, a read-only memory (ROM), or a one-time program (OTP) memory.

5. The operating method of the semiconductor circuit according to claim 1, comprising programing the reference memory array and the main memory array simultaneously during the first timing so as to generate the same first memory state signal S1 to the reference memory array and the main memory array.

6. The operating method of the semiconductor circuit according to claim 5, wherein a memory structure of the reference memory array is identical with a memory structure of the main memory array.

7. The operating method of the semiconductor circuit according to claim 1, comprising:
    reading memory unit state signals of the second timing of memory units of the reference memory array; and
    calculating the memory unit state signals to obtain the second memory state signal S2.

8. The operating method of the semiconductor circuit according to claim 7, wherein the second memory state signal S2 is smaller than a maximum of the memory unit state signals, and is bigger than a minimum of the memory unit state signals.

9. The operating method of the semiconductor circuit according to claim 7, wherein the second memory state signal S2 is a mean, a median, or a mode of the memory unit state signals.

10. The operating method of the semiconductor circuit according to claim 1, wherein:
    the first memory state signal S1 and the second memory state signal S2 have a first electrical measurement unit,
    the input data signal ID has a second electrical measurement unit,
    the un-compensated output data signal OD and the compensated output data signal OD' have a third electrical measurement unit,
    the first electrical measurement unit, the second electrical measurement unit and the third electrical measurement unit are different from each other, and comply with Ohm's law with each other.

11. The operating method of the semiconductor circuit according to claim 10, wherein the first electrical measurement unit is a unit of electrical conductance, the second electrical measurement unit is a unit of voltage, the third electrical measurement unit is a unit of current.

12. The operating method of the semiconductor circuit according to claim 1, wherein,
    SD=S2−S1, wherein S2 of which is the second memory state signal S2 of the reference memory array;
    OD=ID*S2, wherein S2 of which is the another second memory state signal S2 of the second timing of the main memory array;
    OD'=OD−(SD*ID).

* * * * *